(12) United States Patent
Cheng

(10) Patent No.: US 12,727,218 B2
(45) Date of Patent: Sep. 1, 2026

(54) SEMICONDUCTOR STRUCTURE AND METHOD FOR MANUFACTURING THE SAME

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 340 days.

(21) Appl. No.: 18/582,951

(22) Filed: Feb. 21, 2024

(65) Prior Publication Data

US 2025/0126862 A1 Apr. 17, 2025

(30) Foreign Application Priority Data

Oct. 13, 2023 (CN) ........................ 202311330998.7

(51) Int. Cl.

| | |
|---|---|
| ***H01L 29/36*** | (2006.01) |
| ***H01L 21/265*** | (2006.01) |
| ***H01L 29/66*** | (2006.01) |
| ***H01L 29/778*** | (2006.01) |
| ***H01L 29/861*** | (2006.01) |
| ***H10D 8/00*** | (2025.01) |
| ***H10D 8/01*** | (2025.01) |
| ***H10D 30/01*** | (2025.01) |
| ***H10D 30/47*** | (2025.01) |
| ***H10D 62/60*** | (2025.01) |
| ***H10P 30/20*** | (2026.01) |

(52) U.S. Cl.
CPC ............. *H10D 62/60* (2025.01); *H10D 8/043* (2025.01); *H10D 8/411* (2025.01); *H10D 30/015* (2025.01); *H10D 30/475* (2025.01); *H10P 30/206* (2026.01); *H10P 30/212* (2026.01)

(58) Field of Classification Search
CPC ...... H10D 30/015; H10D 62/32; H10D 62/60; H10D 62/824; H10P 14/3416; H10P 30/206; H10P 30/20; H10P 30/28; H10P 30/212
See application file for complete search history.

(56) References Cited

U.S. PATENT DOCUMENTS

2018/0175186 A1* 6/2018 Chen ................. H10D 30/4755

* cited by examiner

*Primary Examiner* — John A Bodnar
(74) *Attorney, Agent, or Firm* — Westbridge IP LLC

(57) ABSTRACT

A semiconductor structure includes a substrate; and a buffer layer and a heterojunction structure layer which are disposed on the substrate sequentially, along a direction perpendicular to a direction from the substrate to the buffer layer, the buffer layer includes a plurality of ion implanted regions disposed at intervals, and the plurality of ion implanted regions include an impurity ion. The impurity ion is implanted into the buffer layer at intervals, so that different threshold voltages are formed at the heterojunction structure layer located at different positions in the buffer layer, which makes devices open gradually in a width direction of channels, to relieve decrease of a trans-conductance curve at a relatively large drain current, improving trans-conductance flatness of the devices, and further improving linearity of the devices.

19 Claims, 5 Drawing Sheets

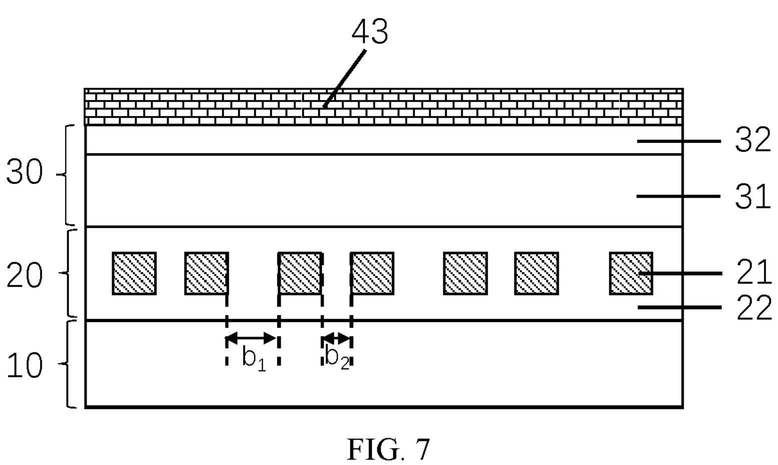
FIG. 7
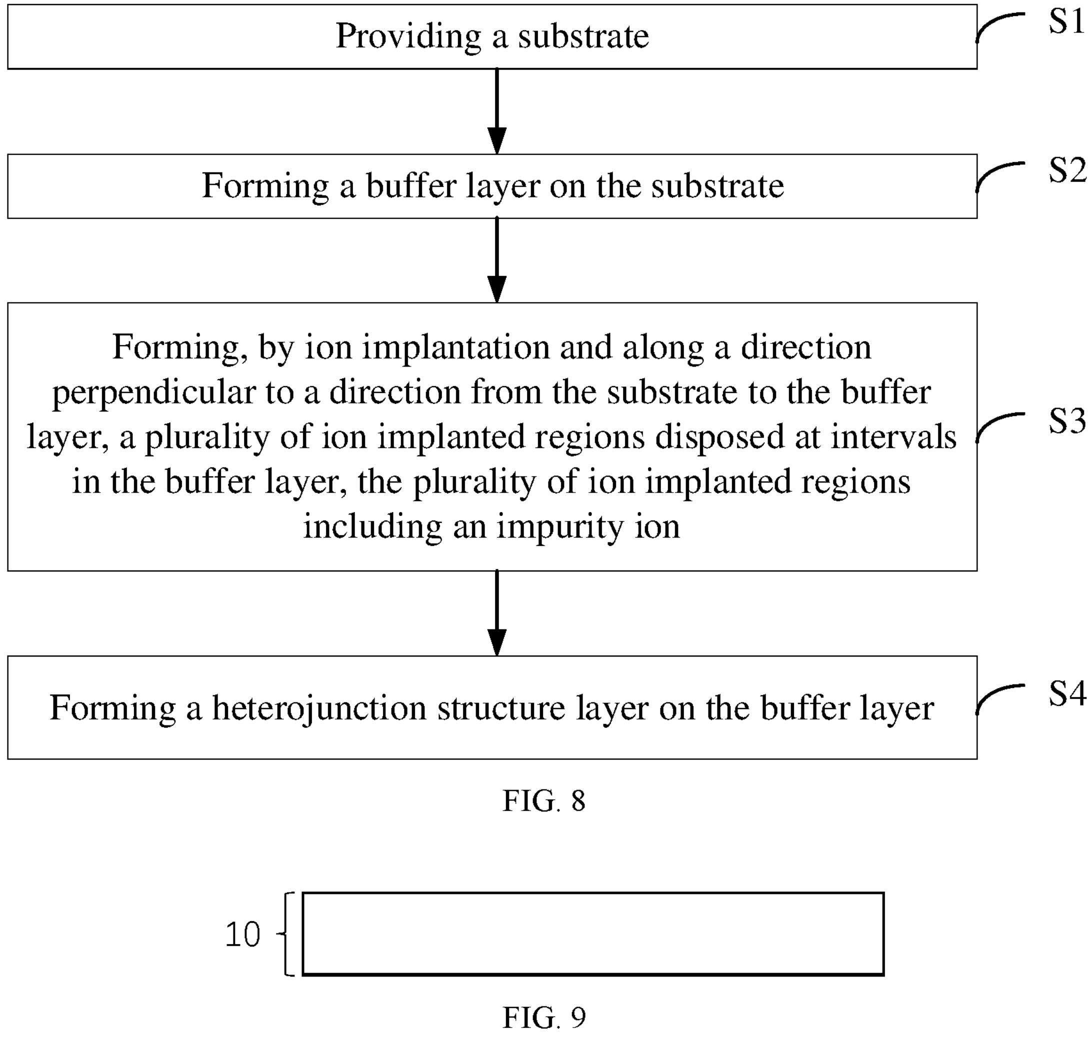
FIG. 8
FIG. 9

SEMICONDUCTOR STRUCTURE AND METHOD FOR MANUFACTURING THE SAME

CROSS-REFERENCE TO RELATED APPLICATIONS

The present disclosure claims priority to Chinese Patent Application No. 202311330998.7, filed on Oct. 13, 2023, the entire content of which is incorporated herein by reference.

TECHNICAL FIELD

The present disclosure relates to the field of semiconductor technologies, in particular, to a semiconductor structure and a method for manufacturing the same.

BACKGROUND

The gallium nitride (GaN) has many advantages such as a large band gap and a high breakdown field strength, AlGaN/GaN heterojunction devices prepared based on the gallium nitride have a high electron mobility, and under a condition of unintentional doping, a two-dimensional electron gas (2DEG) with high concentration is formed at a heterojunction interface through polarization, and therefore, GaN-based devices (such as high electron mobility transistors (HEMTs) or diodes) with a heterojunction have a wide application prospect in the field of microwave power. However, as for the GaN-based devices, there is a serious nonlinear problem, which restricts the application of the GaN-based devices in the field of communications.

SUMMARY

In view of this, embodiments of the present disclosure provide a semiconductor structure and a method for manufacturing the same, so as to improve linearity of GaN-based devices.

According to an aspect of the present disclosure, an embodiment of the present disclosure provides a semiconductor structure, including: a substrate; and a buffer layer and a heterojunction structure layer which are disposed on the substrate sequentially, along a direction perpendicular to a direction from the substrate to the buffer layer, the buffer layer includes a plurality of ion implanted regions disposed at intervals, and the plurality of ion implanted regions include an impurity ion.

As an optional embodiment, the impurity ion includes any one or a combination of silicon or germanium.

As an optional embodiment, the impurity ion includes any one or a combination of magnesium or beryllium.

As an optional embodiment, the impurity ion includes any one or a combination of helium, argon, oxygen, aluminum, arsenic, nitrogen or phosphorus.

As an optional embodiment, the semiconductor structure further includes: a source, a drain and a gate which are disposed on the heterojunction structure layer, the source is located at an end of the heterojunction structure layer, the drain is located at another end of the heterojunction structure layer, and the gate is located between the source and the drain.

As an optional embodiment, each ion implanted region of the plurality of ion implanted regions is a long-strip-shaped nanowire, and an extension direction of each ion implanted region is parallel to a direction from the source to the drain.

As an optional embodiment, the semiconductor structure further includes: an anode electrode and a cathode electrode which are disposed on the heterojunction structure layer, the anode electrode is located at an end of the heterojunction structure layer, the cathode electrode is located at another end of the heterojunction structure layer, and an extension direction of each ion implanted region of the plurality of ion implanted regions is parallel to a direction from the anode electrode to the cathode electrode.

As an optional embodiment, along a direction perpendicular to a direction from the substrate to the heterojunction structure layer, at least two ion implanted regions of the plurality of ion implanted regions have different widths.

As an optional embodiment, along a direction perpendicular to a direction from the substrate to the heterojunction structure layer, at least two pairs of adjacent ion implanted regions in the plurality of ion implanted regions have different spacing distances.

As an optional embodiment, along a direction parallel to a direction from the substrate to the heterojunction structure layer, a thickness of each ion implanted region of the plurality of ion implanted regions is less than or equal to a thickness of the buffer layer.

As an optional embodiment, concentration of the impurity ion of each ion implanted region of the plurality of ion implanted regions is decreased gradually along a direction away from the substrate.

As an optional embodiment, at least one ion implanted region of the plurality of ion implanted regions has impurity ion different from other ion implanted regions, except for the at least one ion implanted region, of the plurality of ion implanted regions.

As an optional embodiment, along a direction perpendicular to a plane where the substrate is located, cross-sectional shapes of the plurality of ion implanted regions include at least one of a rectangle, a triangle, a trapezoid or a water drop shape.

According to another aspect of the present disclosure, an embodiment of the present disclosure provides a method for manufacturing a semiconductor structure, including: S1, providing a substrate; S2, forming a buffer layer on the substrate; S3, forming, by ion implantation and along a direction perpendicular to a direction from the substrate to the buffer layer, a plurality of ion implanted regions disposed at intervals in the buffer layer; and S4, forming a heterojunction structure layer on the buffer layer.

As an optional embodiment, the method for manufacturing the semiconductor structure further includes: S5, forming a source, a drain, and a gate which are disposed on the heterojunction structure layer, the source is located at an end of the heterojunction structure layer, the drain is located at another end of the heterojunction structure layer, and the gate is located between the source and the drain.

As an optional embodiment, an extension direction of each ion implanted region of the plurality of ion implanted regions is controlled to be parallel to a direction from the source to the drain by the ion implantation.

As an optional embodiment, the method for manufacturing a semiconductor structure further includes: forming an anode electrode and a cathode electrode which are disposed on the heterojunction structure layer, the anode electrode is located at an end of the heterojunction structure layer, the cathode electrode is located at another end of the heterojunction structure layer, and an extension direction of each ion implanted region of the plurality of ion implanted regions is parallel to a direction from the anode electrode to the cathode electrode.

As an optional embodiment, the impurity ion includes at least one of silicon, germanium, magnesium, beryllium, helium, argon, oxygen, aluminum, arsenic, nitrogen or phosphorus.

As an optional embodiment, at least one ion implanted region of the plurality of ion implanted regions has impurity ion different from other ion implanted regions, except for the at least one ion implanted region, of the plurality of ion implanted regions.

BRIEF DESCRIPTION OF THE DRAWINGS

FIG. 6 and FIG. 7 are schematic structural diagrams of a semiconductor structure according to an embodiment of the present disclosure.

FIG. 8 is a schematic flowchart of a method for manufacturing a semiconductor structure according to an embodiment of the present disclosure.

FIG. 9 to FIG. 12 are schematic structural diagrams of intermediate structures generated in a manufacturing process of a semiconductor structure according to an embodiment of the present disclosure.

DETAILED DESCRIPTIONS OF THE EMBODIMENTS

The following clearly and completely describes technical solutions in the embodiments of the present disclosure with reference to the accompanying drawings in the embodiments of the present disclosure. Apparently, the described embodiments are a part rather than all of the embodiments of the present disclosure. All other embodiments obtained by a person skilled in the art based on the embodiments of the present disclosure without creative efforts shall fall within the protection scope of the present disclosure.

In order to improve linearity of GaN-based transistor devices with high electron mobility, the present disclosure provides a semiconductor structure and a method for manufacturing the same. The semiconductor structure includes a substrate; and a buffer layer and a heterojunction structure layer which are disposed on the substrate sequentially, along a direction perpendicular to a direction from the substrate to the buffer layer, the buffer layer includes a plurality of ion implanted regions disposed at intervals, and the plurality of ion implanted regions include an impurity ion. In the present disclosure, the impurity ion is implanted into the buffer layer at intervals, so that concentration of a local carrier may be increased or reduced, and space charge modulation is performed on a two-dimensional electron gas in the heterojunction structure layer, forming different threshold voltages at the heterojunction structure layer located at different positions in the buffer layer. Different threshold voltages are formed at the heterojunction structure layer located at different positions in the buffer layer, so that devices are enabled to open gradually in a width direction of channels, to relieve decrease of a trans-conductance curve at a relatively large drain current, improving trans-conductance flatness of the devices, and further improving linearity of the devices.

The following further illustrates a semiconductor structure and a method for manufacturing the same provided by the present disclosure with reference to FIG. 1 to FIG. 12.

Figure 1:
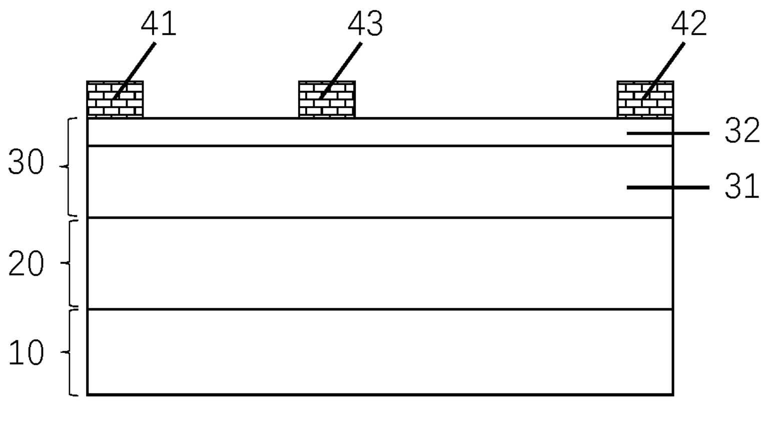
FIG. 1 is a schematic structural diagram of a semiconductor structure according to an embodiment of the present disclosure.
Figure 2:
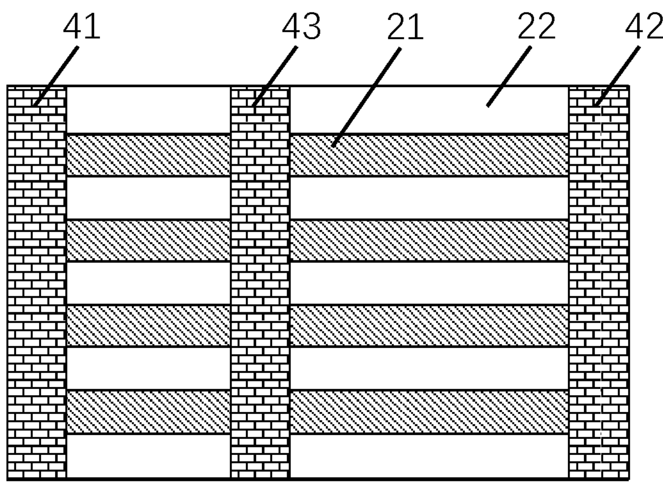
FIG. 2 is a schematic structural diagram of a top view of the semiconductor structure in FIG. 1.
Figure 3:
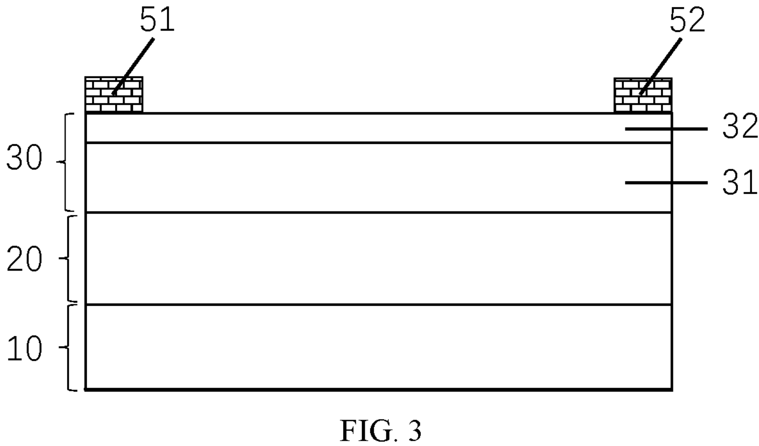
FIG. 3 is a schematic structural diagram of a semiconductor structure according to an embodiment of the present disclosure.

FIG. 1 is a schematic structural diagram of a semiconductor structure according to an embodiment of the present disclosure. FIG. 2 is a schematic structural diagram of a top view of the semiconductor structure in FIG. 1. FIG. 3 is a schematic structural diagram of a semiconductor structure according to an embodiment of the present disclosure. As shown in FIG. 1, a semiconductor structure includes: a substrate 10; a buffer layer 20 and a heterojunction structure layer 30 which are disposed on the substrate 10 sequentially. Along a direction perpendicular to a direction from the substrate 10 to the buffer layer 20 (or along a direction parallel to a plane where the buffer layer 20 is located), the buffer layer 20 includes a plurality of ion implanted regions 21 disposed at intervals (shown in FIG. 2), and the plurality of ion implanted regions 21 include an impurity ion. The buffer layer 20 further includes non-ion implanted regions 22 for wrapping the ion implanted regions 21.

In an embodiment, as shown in FIG. 1, when the semiconductor structure is a HEMT structure, the semiconductor structure further includes: a source 41, a drain 42 and a gate 43 which are disposed on the heterojunction structure layer 30, the source 41 is located at an end of the heterojunction structure layer 30, the drain 42 is located at another end of the heterojunction structure layer 30, and the gate 43 is located between the source 41 and the drain 42. As shown in FIG. 2, each ion implanted region 21 is a long-strip-shaped nanowire, and an extension direction of each ion implanted region 21 is parallel to a direction from the source 41 to the drain 42.

In another embodiment, as shown in FIG. 3, when the semiconductor structure is a diode structure, the semiconductor structure further includes: an anode electrode 51 and a cathode electrode 52 which are disposed on the heterojunction structure layer 30, the anode electrode 51 is located at an end of the heterojunction structure layer 30, the cathode electrode 52 is located at another end of the heterojunction structure layer 30, and an extension direction of each ion implanted region 21 is parallel to a direction from the anode electrode 51 to the cathode electrode 52.

In this embodiment, a material of the buffer layer 20 is a group III nitride material, and the impurity ion in the ion implanted region 21 includes at least one of silicon, germanium, magnesium, beryllium, helium, argon, oxygen, aluminum, arsenic, nitrogen or phosphorus. The impurity ion in the ion implanted region 21 may be any one or a combination of silicon or germanium, so as to increase concentration of a local carrier of the buffer layer 20, increasing concentration of a local two-dimensional electron gas in the heterojunction structure layer 30. The impurity ion in the ion implanted region 21 may also be any one or a combination of magnesium or beryllium. A p-type ion is implanted into the buffer layer 20, so as to compensate doping, reducing the concentration of the local carrier in the buffer layer 20. The impurity ion in the ion implanted region 21 may also be any one or a combination of helium, argon, oxygen, aluminum, arsenic, nitrogen or phosphorus, which may destroy a lattice of a material of the buffer layer 20, so that the lattice of the material of the buffer layer 20 is distorted, and a periodicity of a potential field of the lattice is destroyed, increasing probability of electron scattering, and further reducing the concentration of the local carrier of the buffer layer 20, and increasing a resistivity of the buffer layer 20. Different types of the impurity ion are implanted into the buffer layer 20 at intervals, the concentration of the local carrier can be increased or reduced, and space charge modulation is performed on a two-dimensional electron gas in the heterojunction structure layer 30, forming different threshold voltages at the heterojunction structure layer 30 located at different positions of the buffer layer. Different threshold voltages are formed at the heterojunction structure layer 30 located at different positions of the buffer layer, so that devices are enabled to open gradually in a width direction of channels, to relieve decrease of a trans-conductance curve at a relatively large drain current, improving trans-conductance flatness of the devices, and further improving linearity of the devices.

In an embodiment, concentration of the impurity ion of each ion implanted region 21 is decreased gradually along a direction away from the substrate 10. Doping concentration of the impurity ion in the buffer layer 20 is negatively correlated with a thickness of the buffer layer 20, avoiding doping effects on a high-resistance performance of a side, close to the heterojunction structure layer 30, of the buffer layer 20, and further reducing possibility of leakage.

In an embodiment, the buffer layer 20 includes the plurality of the ion implanted regions 21, at least one ion implanted region of the plurality of ion implanted regions 21 has impurity ion different from other ion implanted regions, except for the at least one ion implanted region, of the plurality of ion implanted regions 21. The plurality of the ion implanted regions 21 are formed in the buffer layer 20 and the impurity ions of the plurality of the ion implanted regions 21 are different, so as to change concentration difference of a carrier of the buffer layer 20, improving linearity of a semiconductor structure.

Figure 4:
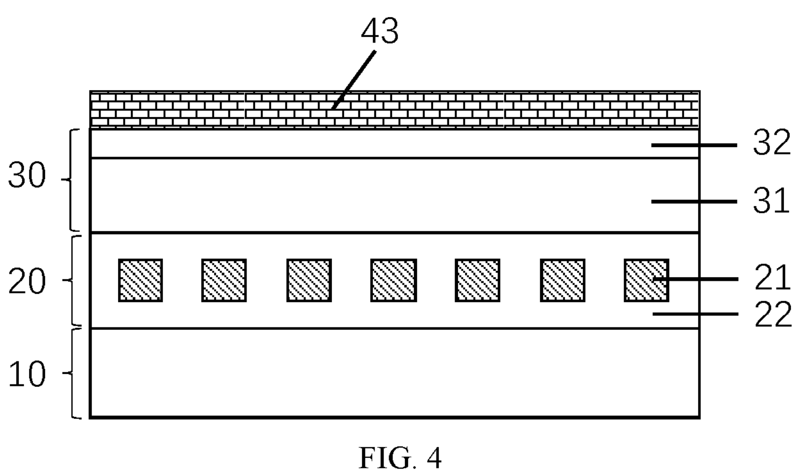
FIG. 4 is a schematic structural diagram of a semiconductor structure according to an embodiment of the present disclosure.
Figure 5A:
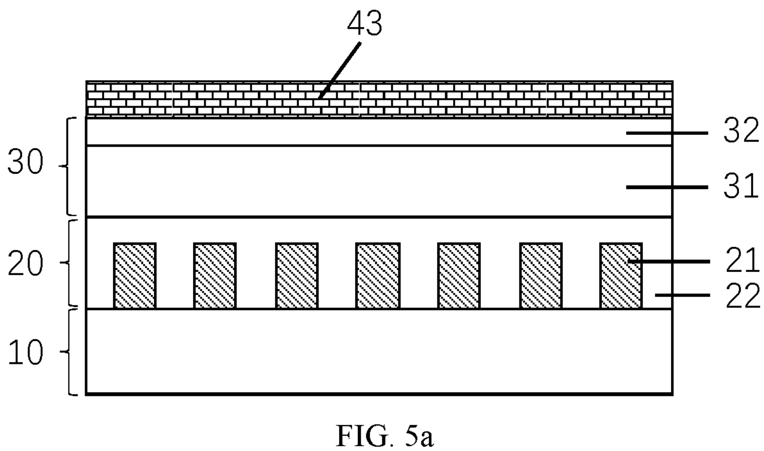
FIG. 5*a* to FIG. 5*d* are schematic structural diagrams of a semiconductor structure according to an embodiment of the present disclosure.
Figure 5B:
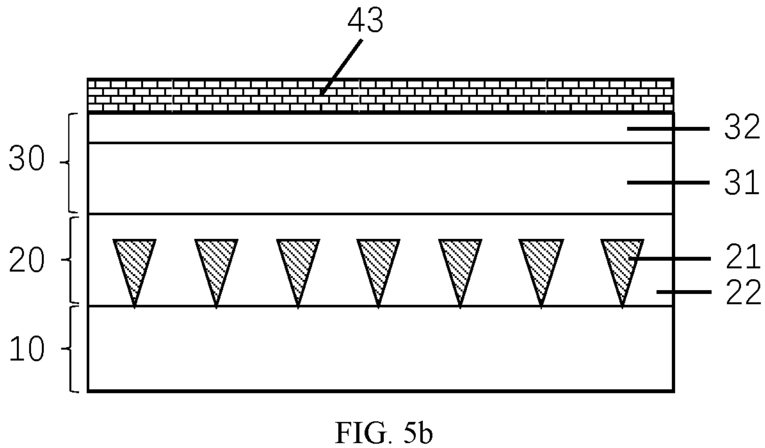
Figure 5C:
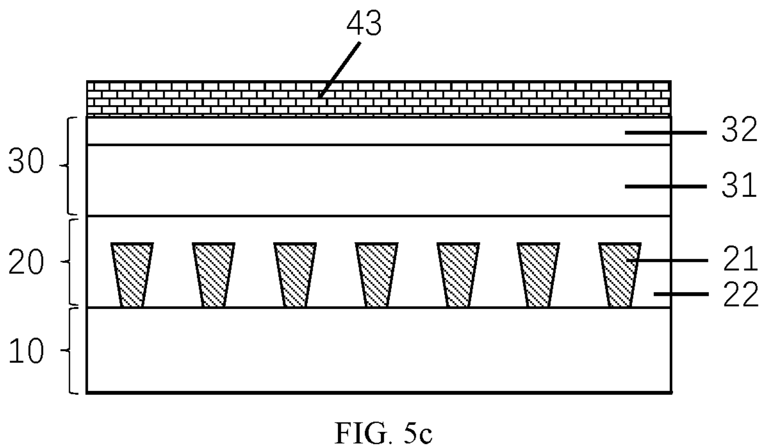
Figure 5D:
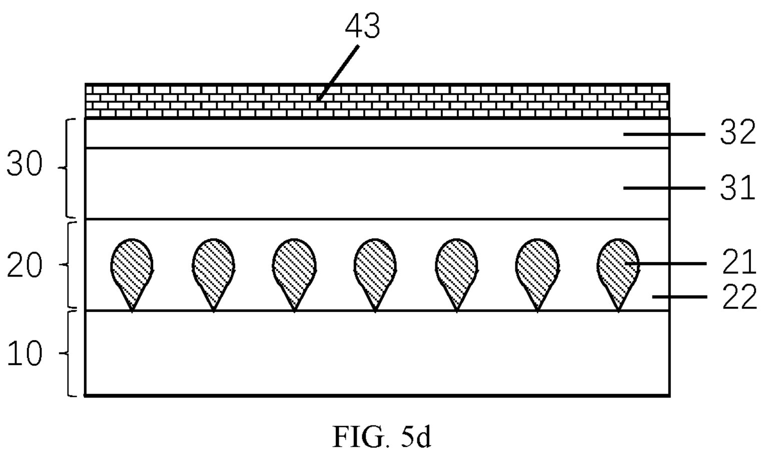

In an embodiment, FIG. 4 is a schematic structural diagram of a semiconductor structure according to an embodiment of the present disclosure. Along a direction parallel to a direction from the substrate 10 to the heterojunction structure layer 30, a thickness of the ion implanted region 21 is less than or equal to a thickness of the buffer layer 20. Optionally, when the thickness of the ion implanted region 21 is less than the thickness of the buffer layer 20, an upper surface, a lower surface and sidewalls of the ion implanted region 21 may be surrounded by the buffer layer 20, or an upper surface and sidewalls of the ion implanted region 21 may be surrounded by the buffer layer 20, or a lower surface and sidewalls of the ion implanted region 21 may be surrounded by the buffer layer 20. In the case that the upper surface of the ion implanted region 21 is surrounded by the buffer layer 20 (shown in FIG. 4), a growth surface used for subsequent epitaxy in the buffer layer 20 is the non-ion implanted region 22, so that the buffer layer 20 has an epitaxial surface with good lattice quality, and defects are not introduced to a surface of the buffer layer 20 while changing the concentration of the carrier of the buffer layer 20, facilitating to form epitaxial layers with good quality during the subsequent epitaxy, and further improving a performance of devices.

In an embodiment, FIG. 5*a* to FIG. 5*d* are schematic structural diagrams of a semiconductor structure according to an embodiment of the present disclosure. Along a direction perpendicular to a plane where the substrate is located, cross-sectional shapes of the plurality of ion implanted regions 21 include at least one of a rectangle, a triangle, a trapezoid or a water drop shape, for example, the cross-sectional shape of the ion implanted region 21 is a rectangle (shown in FIG. 5*a*), a triangle (shown in FIG. 5*b*), a trapezoid (shown in FIG. 5*c*) or a water drop shape (shown in FIG. 5*d*). The cross-sectional shapes of the plurality of ion implanted regions 21 are not limited in the present disclosure.

Figure 6:
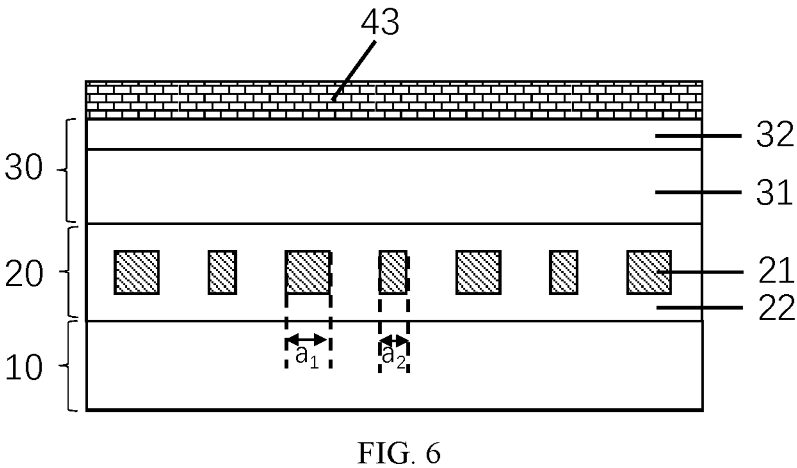

FIG. 6 and FIG. 7 are schematic structural diagrams of a semiconductor structure according to an embodiment of the present disclosure. In an embodiment, as shown in FIG. 6, along a direction perpendicular to a direction from the substrate 10 to the heterojunction structure layer 30, at least two ion implanted regions of the plurality of ion implanted regions 21 have different widths ($a_1$, $a_2$). In another embodiment, as shown in FIG. 7, along a direction perpendicular to a direction from the substrate 10 to the heterojunction structure layer 30, at least two pairs of adjacent ion implanted regions in the plurality of ion implanted regions 21 have different spacing distances ($b_1$, $b_2$). The width of the ion implanted region 21 or the spacing distance between two ion implanted regions 21 is changed, so that a trans-conductance peak value of the heterojunction structure layer 30 subsequently grown at different positions of the buffer layer 20 may be changed, changing a threshold voltage of the heterojunction structure layer 30 located at different positions of the buffer layer 20, and further improving linearity operating characteristic of devices.

According to another aspect of the present disclosure, FIG. 8 is a schematic flowchart of a method for manufacturing a semiconductor structure according to an embodiment of the present disclosure. FIG. 9 to FIG. 12 are schematic structural diagrams of intermediate structures generated in a manufacturing process of a semiconductor structure according to an embodiment of the present disclosure. As shown in FIG. 8, a method for manufacturing a semiconductor structure provided by an embodiment of the present disclosure includes the following steps.

Step S1, shown in FIG. 9, providing a substrate 10. A material of the substrate 10 includes any one or a combination of Si, $Al_2O_3$, GaN, SiC or AlN.

Figure 10:
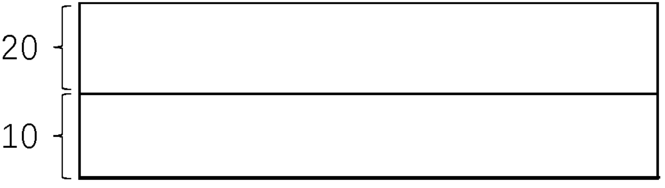

Step S2, shown in FIG. 10, forming a buffer layer 20 on the substrate 10. A material of the buffer layer 20 is a group III nitride material, and the group III nitride material may include one or more of GaN, AlGaN or AlInGaN, which is not limited thereto.

Figure 11:
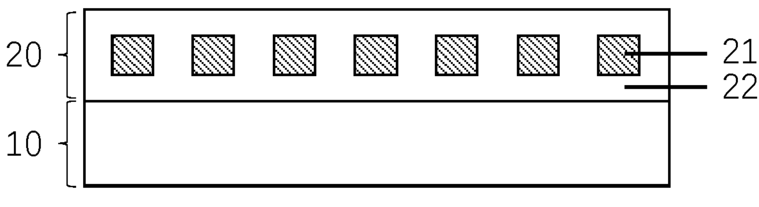

Step S3, shown in FIG. 11, forming, by ion implantation and along a direction perpendicular to a direction from the substrate 10 to the buffer layer 20, a plurality of ion implanted regions 21 disposed at intervals in the buffer layer 20, the plurality of ion implanted regions 21 including an impurity ion. Non-ion implanted regions 22 for wrapping the plurality of ion implanted regions 21 are formed in the buffer layer 20 without the ion implantation, and a surface, away from the substrate 10, of the buffer layer 20 may be the non-ion implanted region 22.

In this embodiment, the impurity ion implanted into the buffer layer 20 includes at least one of silicon, germanium, magnesium, beryllium, helium, argon, oxygen, aluminum, arsenic, nitrogen or phosphorus. The impurity ion in the ion implanted region 21 may be any one or a combination of silicon or germanium, so as to increase concentration of a local carrier of the buffer layer 20, increasing concentration of a local two-dimensional electron gas in the heterojunction structure layer 30. The impurity ion in the ion implanted region 21 may also be any one or a combination of magnesium or beryllium. A p-type ion is implanted into the buffer layer 20, so as to compensate doping, reducing the concentration of the local carrier of the buffer layer 20. The impurity ion in the ion implanted region 21 may also be any one or a combination of helium, argon, oxygen, aluminum, arsenic, nitrogen or phosphorus, which may destroy a lattice of a material of the buffer layer 20, so that the lattice of the material of the buffer layer 20 is distorted, and a periodicity of a potential field of the lattice is destroyed, increasing probability of electron scattering, and further reducing the concentration of the local carrier of the buffer layer 20, and increasing a resistivity of the buffer layer 20. Different types of the impurity ion are implanted into the buffer layer 20 at intervals, the concentration of the local carrier can be increased or reduced, and space charge modulation is performed on a two-dimensional electron gas in the heterojunction structure layer 30, forming different threshold voltages at the heterojunction structure layer 30 located at different positions of the buffer layer. Different threshold voltages are formed at the heterojunction structure layer 30 located at different positions of the buffer layer, so that devices are enabled to open gradually in a width direction of channels, to relieve decrease of a trans-conductance curve at a relatively large drain current, improving trans-conductance flatness of devices, and further improving linearity of the devices. The plurality of ion implanted regions 21 are formed in the buffer layer 20 by the ion implantation, and at least one ion implanted region of the plurality of ion implanted regions 21 has impurity ion different from other ion implanted regions, except for the at least one ion implanted region, of the plurality of ion implanted regions 21. An extension direction of each ion implanted region 21 may be controlled, by the ion implantation, to parallel to a direction from a source 41 to a drain 42 which is subsequently disposed (shown in FIG. 2).

Figure 12:
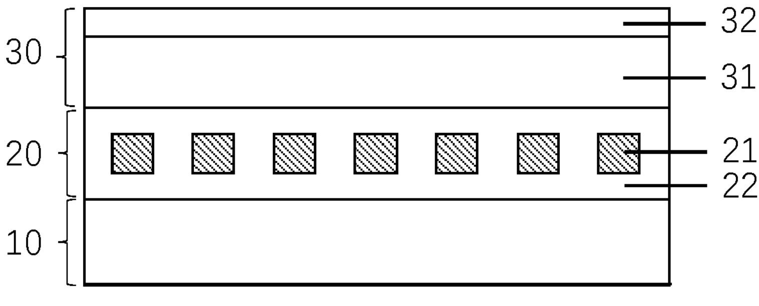

Step S4, shown in FIG. 12, forming a heterojunction structure layer 30 on the buffer layer 20. The heterojunction structure layer 30 includes a channel layer 31 and a barrier layer 32, and a two-dimensional electron gas may be formed at an interface between the channel layer 31 and the barrier layer 32. In an optional implementation, the channel layer 31 is a GaN layer, and the barrier layer 32 is an AlGaN layer. In other optional implementations, a combination of materials of the channel layer 31 and the barrier layer 32 may also be one of GaN/AlN, GaN/InN, GaN/InAlGaN, GaAs/AlGaAs, GaN/InAlN or InN/InAlN.

In an embodiment, the method for manufacturing the semiconductor structure further includes Step S5: shown in FIG. 1, forming a source 41, a drain 42, and a gate 43 which are disposed on the heterojunction structure layer 30. The source 41 is located at an end of the heterojunction structure layer 30, the drain 41 is located at another end of the heterojunction structure layer 30, and the gate 43 is located between the source 41 and the drain 42. The source 41, the drain 42 and the gate 43 are formed on the heterojunction structure layer 30, so that a HEMT structure is formed.

In another embodiment, the method for manufacturing the semiconductor structure further includes: shown in FIG. 3, forming an anode electrode 51 and a cathode electrode 52 which are disposed on the heterojunction structure layer 30. The anode electrode 51 is located at an end of the heterojunction structure layer 30, the cathode electrode 52 is located at another end of the heterojunction structure layer 30, and an extension direction of each ion implanted region 21 is parallel to a direction from the anode electrode 51 to the cathode electrode 52. The anode electrode 51 and the cathode electrode 52 are formed on the heterojunction structure layer 30, so that a diode structure is formed.

The present disclosure provides a semiconductor structure and a method for manufacturing the same. The semiconductor structure includes a substrate; and a buffer layer and a heterojunction structure layer which are disposed on the substrate sequentially, along a direction perpendicular to a direction from the substrate to the buffer layer, the buffer layer includes a plurality of ion implanted regions disposed at intervals, and the plurality of ion implanted regions includes an impurity ion. In the present disclosure, the impurity ion is implanted into the buffer layer at intervals, so that concentration of a local carrier may be increased or reduced, and space charge modulation is performed on a two-dimensional electron gas in the heterojunction structure layer, forming different threshold voltages at the heterojunction structure layer located at different positions in the buffer layer. Different threshold voltages are formed at the heterojunction structure layer located at different positions in the buffer layer, so that devices are enabled to open gradually in a width direction of channels, to relieve decrease of a trans-conductance curve at a relatively large drain current, improving trans-conductance flatness of the devices, and further improving linearity of the devices.

It should be understood that the terms "comprising", "including" and variations thereof used in the present disclosure are open ended, i.e., "including but not limited to". The term "an embodiment" means "at least one embodiment"; and the term "other embodiment" means "at least one further embodiment". In this specification, schematic representation of the above terms does not necessarily refer to the same embodiment or example. Furthermore, specific features, structures, materials, or characteristics described may be combined in any suitable manner in any one or more embodiments or examples. In addition, in the case of no contradiction, a person skilled in the art may combine and integrate different embodiments or examples described in this specification, as well as features of different embodiments or examples.

The above are only preferred embodiments of the present disclosure, and are not intended to limit the protection scope of the present disclosure. Any modification and equivalent replacement made within the spirit and principle of the present disclosure shall be included within the protection scope of the present disclosure.

What is claimed is:

1. A semiconductor structure, comprising:

a substrate; and a buffer layer and a heterojunction structure layer which are disposed on the substrate sequentially, wherein along a direction perpendicular to a direction from the substrate to the buffer layer, the buffer layer comprises a plurality of ion implanted regions disposed at intervals, and the plurality of ion implanted regions comprise an impurity ion.

2. The semiconductor structure according to claim 1, wherein the impurity ion comprises any one or a combination of silicon or germanium.

3. The semiconductor structure according to claim 1, wherein the impurity ion comprises any one or a combination of magnesium or beryllium.

4. The semiconductor structure according to claim 1, wherein the impurity ion comprises any one or a combination of helium, argon, oxygen, aluminum, arsenic, nitrogen or phosphorus.

5. The semiconductor structure according to claim 1, further comprising:

a source, a drain and a gate which are disposed on the heterojunction structure layer, wherein the source is located at an end of the heterojunction structure layer, the drain is located at another end of the heterojunction structure layer, and the gate is located between the source and the drain.

6. The semiconductor structure according to claim 5, wherein each ion implanted region of the plurality of ion implanted regions is a long-strip-shaped nanowire, and an extension direction of each ion implanted region is parallel to a direction from the source to the drain.

7. The semiconductor structure according to claim 1, further comprising:

an anode electrode and a cathode electrode which are disposed on the heterojunction structure layer, wherein the anode electrode is located at an end of the heterojunction structure layer, the cathode electrode is located at another end of the heterojunction structure layer, and an extension direction of each ion implanted region of the plurality of ion implanted regions is parallel to a direction from the anode electrode to the cathode electrode.

8. The semiconductor structure according to claim 1, wherein along a direction perpendicular to a direction from the substrate to the heterojunction structure layer, at least two ion implanted regions of the plurality of ion implanted regions have different widths.

9. The semiconductor structure according to claim 1, wherein along a direction perpendicular to a direction from the substrate to the heterojunction structure layer, at least two pairs of adjacent ion implanted regions in the plurality of ion implanted regions have different spacing distances.

10. The semiconductor structure according to claim 1, wherein along a direction parallel to a direction from the substrate to the heterojunction structure layer, a thickness of each ion implanted region of the plurality of ion implanted regions is less than or equal to a thickness of the buffer layer.

11. The semiconductor structure according to claim 1, wherein concentration of the impurity ion of each ion implanted region of the plurality of ion implanted regions is decreased gradually along a direction away from the substrate.

12. The semiconductor structure according to claim 1, wherein at least one ion implanted region of the plurality of ion implanted regions has impurity ion different from other ion implanted regions, except for the at least one ion implanted region, of the plurality of ion implanted regions.

13. The semiconductor structure according to claim 1, wherein along a direction perpendicular to a plane where the substrate is located, cross-sectional shapes of the plurality of ion implanted regions comprise at least one of a rectangle, a triangle, a trapezoid or a water drop shape.

14. A method for manufacturing a semiconductor structure, comprising:

S1, providing a substrate;

S2, forming a buffer layer on the substrate;

S3, forming, by ion implantation and along a direction perpendicular to a direction from the substrate to the buffer layer, a plurality of ion implanted regions disposed at intervals in the buffer layer, the plurality of ion implanted regions comprising an impurity ion; and S4, forming a heterojunction structure layer on the buffer layer.

15. The method for manufacturing the semiconductor structure according to claim 14, further comprising:

S5, forming a source, a drain and a gate which are disposed on the heterojunction structure layer, wherein the source is located at an end of the heterojunction structure layer, the drain is located at another end of the heterojunction structure layer, and the gate is located between the source and the drain.

16. The method for manufacturing the semiconductor structure according to claim 15, wherein an extension direction of each ion implanted region of the plurality of ion implanted regions is controlled to be parallel to a direction from the source to the drain by the ion implantation.

17. The method for manufacturing the semiconductor structure according to claim 14, further comprising:

forming an anode electrode and a cathode electrode which are disposed on the heterojunction structure layer, wherein the anode electrode is located at an end of the heterojunction structure layer, the cathode electrode is located at another end of the heterojunction structure layer, and an extension direction of each ion implanted region of the plurality of ion implanted regions is parallel to a direction from the anode electrode to the cathode electrode.

18. The method for manufacturing a semiconductor structure according to claim 14, wherein the impurity ion comprises at least one of silicon, germanium, magnesium, beryllium, helium, argon, oxygen, aluminum, arsenic, nitrogen or phosphorus.

19. The method for manufacturing the semiconductor structure according to claim 14, wherein at least one ion implanted region of the plurality of ion implanted regions has impurity ion different from other ion implanted regions, except for the at least one ion implanted region, of the plurality of ion implanted regions.

* * * * *